United States Patent
Wee et al.

(10) Patent No.: US 9,877,363 B2
(45) Date of Patent: Jan. 23, 2018

(54) DEVICE AND METHOD FOR PROVIDING REGULATED CURRENT TO AN ELECTRICAL LOAD

(71) Applicant: OPULENT ELECTRONICS INTERNATIONAL PTE LTD, Singapore (SG)

(72) Inventors: Francis Kai Fook Wee, Singapore (SG); Leopoldo Groppi, Pieve Emanuele (IT); Andrea Stona, Bolzano (IT)

(73) Assignee: OPULENT ELECTRONICS INTERNATIONAL PTE LTD, Singapore (SG)

( * ) Notice: Subject to any disclaimer, the term of this patent is extended or adjusted under 35 U.S.C. 154(b) by 0 days.

(21) Appl. No.: 15/112,425

(22) PCT Filed: Feb. 9, 2015

(86) PCT No.: PCT/SG2015/050016
§ 371 (c)(1),
(2) Date: Jul. 18, 2016

(87) PCT Pub. No.: WO2015/122848
PCT Pub. Date: Aug. 20, 2015

(65) Prior Publication Data
US 2016/0338159 A1    Nov. 17, 2016

(30) Foreign Application Priority Data

Feb. 11, 2014   (SG) ................................ 2014010839

(51) Int. Cl.
*H05B 37/02* (2006.01)
*H05B 33/08* (2006.01)
(Continued)

(52) U.S. Cl.
CPC ...... *H05B 33/0815* (2013.01); *H02M 1/4208* (2013.01); *H02M 1/4258* (2013.01);
(Continued)

(58) Field of Classification Search
CPC .............. H05B 33/0815; H05B 33/083; H05B 33/0845
(Continued)

(56) References Cited

U.S. PATENT DOCUMENTS 7,433,211 B1    10/2008  Collmeyer et al.
7,759,881 B1 *   7/2010  Melanson .......... H05B 33/0815
                                                315/224
(Continued)

FOREIGN PATENT DOCUMENTS

WO    2013066270 A1    5/2013

OTHER PUBLICATIONS

PCT/SG2015/050016 International Search Report and Written Opinion dated Apr. 13, 2015; International Preliminary Report on Patentability dated Sep. 21, 2015.

*Primary Examiner* — Tung X Le
(74) *Attorney, Agent, or Firm* — Joseph G. Chu; JCIP (57) ABSTRACT

A device for providing regulated current to an electrical load comprising a current controller operable at predetermined intervals (clock cycles) to receive:—i. a desired input reference voltage; and ii. a feedback voltage obtained from an electronic switch; wherein the current controller is operable to compare the feedback voltage with the desired input reference voltage and provide regulated current to the electrical load based on calculation of the switch off time of the electronic switch at each clock cycle; the calculation of the switch off time operable to achieve a continuous-conduction-mode (CCM) for the device under normal operating conditions, is disclosed.

22 Claims, 3 Drawing Sheets

(51) Int. Cl.
*H02M 1/42* (2007.01)
*H02M 3/335* (2006.01)
*H03M 1/12* (2006.01)

(52) U.S. Cl.
CPC ......... *H02M 3/33515* (2013.01); *H03M 1/12* (2013.01); *H05B 33/0845* (2013.01); *Y02B 20/347* (2013.01); *Y02B 70/126* (2013.01)

(58) Field of Classification Search
USPC ........................................ 315/224, 294, 307
See application file for complete search history.

(56) References Cited

U.S. PATENT DOCUMENTS

| | | | |
|---|---|---|---|
| 2006/0015274 A1 | 1/2006 | Trandafir et al. | |
| 2007/0121349 A1* | 5/2007 | Mednik ............. | H02M 3/33523 363/21.01 |
| 2009/0079355 A1 | 3/2009 | Zhou et al. | |
| 2011/0109249 A1* | 5/2011 | Liu ................... | H05B 33/0809 315/307 |
| 2011/0199023 A1* | 8/2011 | Zimmermann .... | H05B 33/0818 315/297 |
| 2013/0187566 A1* | 7/2013 | Hsu ................... | H05B 33/0818 315/294 |
| 2015/0076999 A1* | 3/2015 | Malinin ............. | H05B 33/0815 315/186 |

* cited by examiner

DEVICE AND METHOD FOR PROVIDING REGULATED CURRENT TO AN ELECTRICAL LOAD

This application is a National Stage application of International Application No. PCT/SG2015/050016, filed Feb. 9, 2015, the entire contents of which are incorporated herein by reference.

Applicants claim the priority filing date of Feb. 11, 2014 of the Singapore patent application Serial Number 2014010839, the entire contents of which are incorporated herein by reference.

FIELD OF THE INVENTION

The present invention relates to a driver system. In particular the invention relates to switch-mode power supply devices operable in continuous conduction mode and will be described in this context.

BACKGROUND

The following discussion of the background to the invention is intended to facilitate an understanding of the present invention only. It should be appreciated that the discussion is not an acknowledgement or admission that any of the material referred to was published, known or part of the common general knowledge of the person skilled in the art in any jurisdiction as at the priority date of the invention.

Switched mode power supplies are often utilized for driving one or more applications. In particular, Light Emitting Diodes (LEDs) lamps are often driven by controller circuits. As LEDs are sensitive to current and voltage fluctuations, one of the most important objectives for LED controller circuits is to provide appropriate current to drive the LEDs under supply voltage or load variations.

Many LED switched-mode based controllers involve the use of electronic switches such as MOSFET as a means for regulating the current input to the LEDs. As such, the control of the frequency and on/off time for switching is an important parameter to consider in all switched-mode based controllers.

There exists an on-going need to improve switching control of LED drivers to achieve one or more of the following:—
i. reduction in overall component count such as capacitor(s);
ii. reduction in form factor of each component; and/or
iii. proper over-voltage/short circuit protection.

In addition, there also exists a need to move away from secondary voltage feedback type controls as it places an undesirable burden on the transformer or inductive transfer elements.

It is thus an object of the invention to overcome, or at least ameliorate in part, one or more of the aforementioned problems.

SUMMARY OF THE INVENTION

In accordance with an aspect of the present invention, there is provided a device for providing regulated current to an electrical load comprising a current controller operable at predetermined intervals (clock cycles) to receive a desired input reference voltage; and a feedback voltage obtained from an electronic switch; wherein the current controller is operable to compare the feedback voltage with the desired input reference voltage and provide regulated current to the electrical load based on calculation of the switch off time of the electronic switch at each clock cycle; the calculation of the switch off time operable to achieve a continuous-conduction-mode (CCM) for the device under normal operating conditions.

Preferably, the electronic switch is a MOSFET.

Preferably, the feedback voltage is measured at the source of the MOSFET at each clock cycle and compared with a maximum operation voltage $V_{refh}$ via a voltage comparator.

Preferably, the feedback voltage is measured at the source of the MOSFET at each clock cycle and compared with a minimum operation voltage $V_{refl}$ via a voltage comparator.

Preferably, the feedback voltage is measured at the source of the MOSFET at each clock cycle and compared with a safety voltage value $V_{ocp}$ via a voltage comparator.

Preferably, for a single stage flyback convertor configuration the current controller determines the regulated current $I_{LED}$ based on the mathematical expression $$I_{LED} = \frac{T_{OFF}\left(\frac{V_{fbh}}{R_1} + \frac{V_{fbm}}{R_1}\right)}{2T}$$

Where T is the period of each clock cycle; $T_{OFF}$ is the switch-off period at each clock cycle; $R_1$ is the MOSFET source resistor; $V_{fbh}$ is highest feedback voltage measured at the source of the MOSFET at each clock cycle; and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the MOSFET switch on time at each switching period, $T_W$ is the time from the MOSFET switch on signal to the lowest feedback voltage $V_{fbl}$ measured at the source of the MOSFET at each clock cycle; and $T_W$ is the time from the MOSFET switch on signal to the voltage $V_{fbl}$ trigger point.

Preferably, for a single stage forward structure, push-pull configuration or DC to DC hysteretic controller, the current controller determines the regulated current $I_{LED}$ based on the mathematical expression $$I_{LED} = \frac{\frac{V_{fbm}}{R_1} + \frac{V_{fbh}}{R_1}}{2}$$

where $R_1$ is the MOSFET source resistor; $V_{fbh}$ is highest feedback voltage measured at the source of the MOSFET at each clock cycle; and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the MOSFET switch on time at each switching period, $T_W$ is the time from the MOSFET switch on signal to the lowest feedback voltage $V_{fbl}$ measured at the source of the MOSFET at each clock cycle; and $T_W$ is a predetermined time parameter.

Preferably, for a single stage flyback convertor configuration the voltage across the electrical load $V_{LOAD}$ is determined based on the following mathematical expression $$V_{load} = \frac{V_{IN}T_{ON}}{T_{OFF}} \frac{N_S}{N_P}$$

where $N_P$ is the primary winding number and $N_s$ is the secondary winding number of the transfer inductor (or transformer) in the flyback convertor configuration.

Preferably, for a single stage forward structure, push-pull configuration or DC to DC hysteretic controller, the voltage across the electrical load $V_{LOAD}$ is determined based on the following mathematical expression $$V_{LOAD} = \frac{V_{IN}}{V_{OFF}}T$$

Where T is the period of the clock cycle.

Preferably, the input voltage $V_{IN}$ is used to shape the input current $I_{IN}$ based on the following mathematical expression
$I_{IN} = \alpha V_{IN}$
Where $\alpha$ is a multiplier.

Preferably, the input voltage $V_{IN}$ is used to shape the input current $I_{IN}$ based on the following mathematical expression $$I_{IN} = \alpha V_{IN}$$

Where $\alpha$ is a multiplier.

In accordance with a second aspect of the invention there is a method for providing regulated current to an electrical load comprising the steps of receiving from a current controller a desired input reference voltage and a feedback voltage obtained from an electronic switch at predetermined intervals; wherein the current controller is operable to compare the feedback voltage with the desired input reference voltage and provide regulated current to the electrical load based on calculation of the switch off time of the electronic switch at each of the predetermined interval; the calculation of the switch off time operable to achieve a continuous-conduction-mode (CCM) for the device under normal operating conditions.

Preferably, the electronic switch is a MOSFET.

Preferably, the feedback voltage is measured at the source of the MOSFET at each clock cycle and compared with a maximum operation voltage $V_{refh}$ via a voltage comparator.

Preferably, the feedback voltage is measured at the source of the MOSFET at each clock cycle and compared with a minimum operation voltage $V_{refl}$ via a voltage comparator.

Preferably, the feedback voltage is measured at the source of the MOSFET at each clock cycle and compared with a safety voltage value $V_{ocp}$ via a voltage comparator.

Preferably, for a single stage flyback convertor configuration the current controller determines the regulated current $I_{LED}$ based on the mathematical expression $$I_{LED} = \frac{T_{OFF}\left(\frac{V_{fbh}}{R_1} + \frac{V_{fbm}}{R_1}\right)}{2T}$$

Where T is the period of each clock cycle; $T_{OFF}$ is the switch-off period at each clock cycle; $R_1$ is the MOSFET source resistor; $V_{fbh}$ is highest feedback voltage measured at the source of the MOSFET at each clock cycle;

and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the MOSFET switch on time at each switching period, $T_W$ is the time from the MOSFET switch on signal to the lowest feedback voltage $V_{fbl}$ measured at the source of the MOSFET at each clock cycle; and $T_W$ is the time from the MOSFET switch on signal to the voltage $V_{fbl}$ trigger point.

Preferably, for a single stage forward structure, push-pull configuration or DC to DC hysteretic controller, the current controller determines the regulated current $I_{LED}$ based on the mathematical expression $$I_{LED} = \frac{\frac{V_{fbm}}{R_1} + \frac{V_{fbm}}{R_1}}{2}$$

where $R_1$ is the MOSFET source resistor; $V_{fbh}$ is highest feedback voltage measured at the source of the MOSFET at each clock cycle;

and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the MOSFET switch on time at each switching period, $T_W$ is the time from the MOSFET switch on signal to the lowest feedback voltage $V_{fbl}$ measured at the source of the MOSFET at each clock cycle; and $T_W$ is a predetermined time parameter.

Preferably, for a single stage flyback convertor configuration, the voltage across the electrical load $V_{LOAD}$ is determined based on the following mathematical expression $$V_{load} = \frac{V_{IN}T_{ON}}{T_{OFF}} \frac{N_S}{N_P}$$

where $N_P$ is the primary winding number and $N_s$ is the secondary winding number of the transfer inductor (or transformer) in the flyback convertor configuration.

Preferably, for a single stage forward structure, push-pull configuration or DC to DC hysteretic controller, the voltage across the electrical load $V_{LOAD}$ is determined based on the following mathematical expression $$V_{LOAD} = \frac{V_{IN}}{V_{OFF}}T$$

Where T is the period of the clock cycle.

Preferably, the input voltage $V_{IN}$ is used to shape the input current $I_{IN}$ based on the following mathematical expression $$I_{IN} = \alpha V_{IN}$$

Where $\alpha$ is a multiplier.

Preferably, the input voltage $V_{IN}$ is used to shape the input current $I_{IN}$ based on the following mathematical expression $$I_{IN} = \alpha V_{IN}$$

Where $\alpha$ is a multiplier.

BRIEF DESCRIPTION OF THE DRAWINGS

The present invention will now be described, by way of example only, with reference to the accompanying drawings, in which.

Other arrangements of the invention are possible and, consequently, the accompanying drawings are not to be understood as superseding the generality of the preceding description of the invention.

PREFERRED EMBODIMENTS OF THE INVENTION

In the context of the description, continuous-conduction-mode (CCM) is referred to the operation mode where electrical voltage and electrical current in the energy transfer inductor (or transformer) never goes to zero between switching cycles. This is contrasted with the discontinuous-conduction-mode (DCM) where the electrical voltage and current goes to zero during part of the switching cycle.

Throughout the specification, unless otherwise stated, reference to 'voltage' and 'current' refers to electrical voltage and electrical current.

Figure 1:
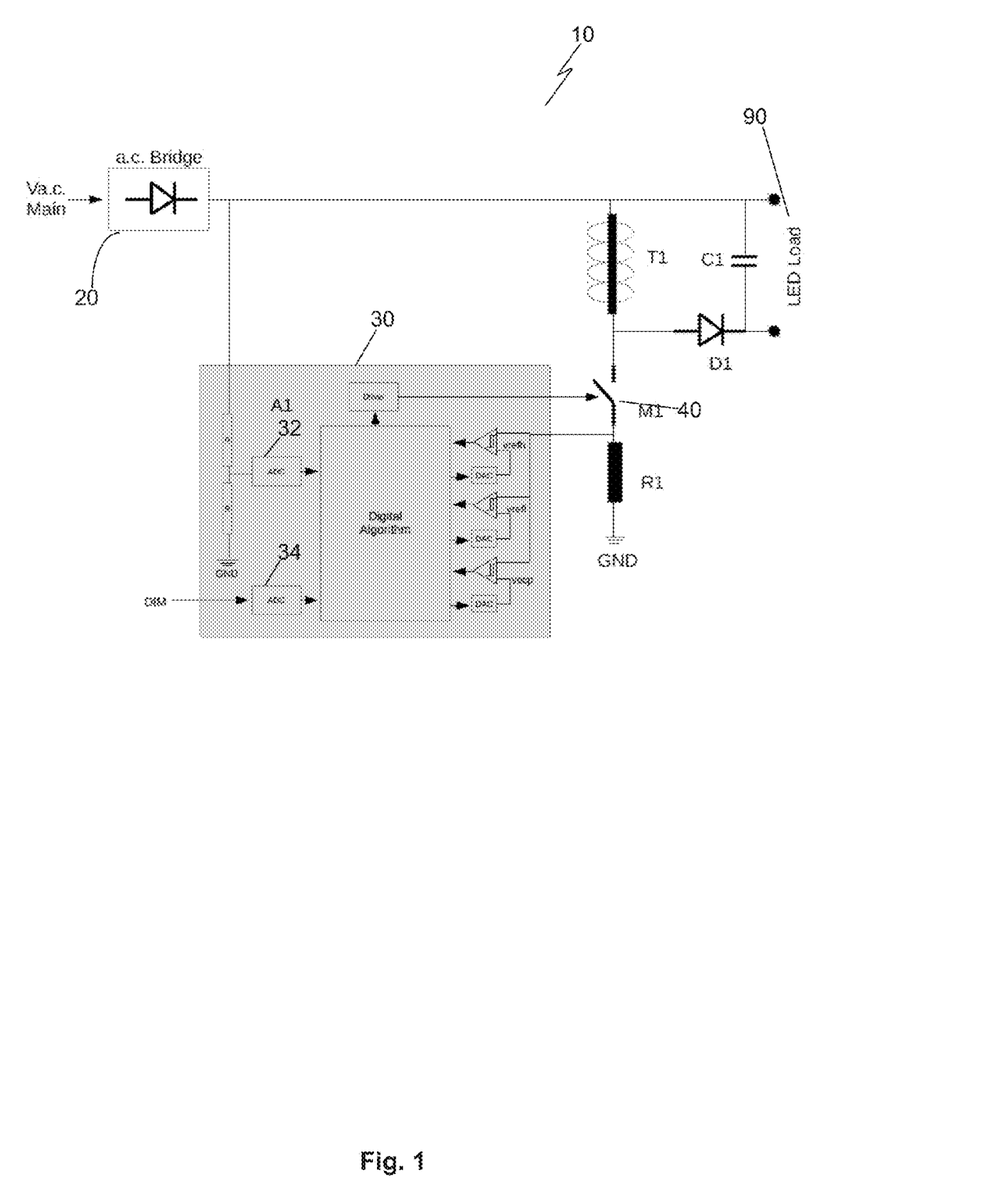
FIG. 1 is a circuit block diagram for an AC to DC single stage flyback convertor configuration in accordance with an embodiment of the invention.

In accordance with an embodiment of the invention and with reference to FIG. 1 there is a LED driver 10 implemented as a single stage flyback convertor configuration. The LED driver 10 has a primary side comprising V.A.C mains 20, a controller circuit 30, an electronic switch 40, and a secondary side comprising the LED load 90.

V.A.C. mains 20 comprise rectification circuitries such as bridge rectifiers necessary for the conversion of AC voltage and current to DC voltage and current. The rectified AC input from the VAC mains 20 are fed into the controller circuit 30 for processing.

Controller circuit 30 is operable to control the switching time of electronic switch 40 at regular intervals (each interval may correspond with a pre-defined switching cycle) for regulating the electrical voltage and/or current provided to the LED load 90. Controller circuit 30 is typically an integrated circuit (IC) and more preferably, an application specific integrated circuit (ASIC) which may be programmed using one or more of the following hardware description language (HDL) such as Verilog, VHDL, or other hardware description language as known to a person skilled in the art.

The electronic switch 40 is typically a metal-oxide-semiconductor field-effect transistor (MOSFET). The source of the MOSFET switch 40 is connected in series with one end of a resistor R1, while the other end of the resistor R1 connected to electrical ground. The value of the resistor R1 is important to determine the output current $I_{LED}$ selected for the LED, as will be mathematically expressed in equation (1) below.

The controller circuit 30 is programmed and configured to receive five inputs; i.e.

(a.) Input voltage $V_{IN}$;

(b.) A $V_{fbh}$ voltage value measured at the source of the MOSFET 40 at each switching cycle and compared with the maximum operation voltage allowable $V_{refh}$ via a voltage comparator;

(c.) A $V_{fbl}$ voltage value measured at the source of the MOSFET 40 at each switching cycle and compared with the minimum operation voltage allowable $V_{refl}$ via a voltage comparator;

(d.) A $V_{ocp}$ voltage value measured at the source of the MOSFET 40 at each switching cycle and compared with a safety voltage value $V_{ocp}$ via a voltage comparator; and (e.) One or more timer counter(s) for determining the clock cycles and switching time period of the MOSFET 40.

With the described five inputs, controller circuit 30 comprises a digital algorithm (programmable using ASIC) to implement the following equation (1) so as to determine the current $I_{LED}$ to be provided to the LED load 90:—

$$I_{LED} = \frac{T_{OFF}\left(\frac{V_{fbh}}{R_1} + \frac{V_{fbm}}{R_1}\right)}{2T} \quad (1)$$

Where T is the period of the switching cycle and $T_{OFF}$ is the switch-off period at each clock cycle.

The voltage value $V_{fbm}$ is calculated using the following equation (2) mathematically expressed as:—

$$V_{fbm} = \frac{T_{ON}V_{fbl} - T_w V_{fbh}}{T_{ON} - T_w} \quad (2)$$

where $T_{ON}$ is the MOSFET 40 transistor switch on time at each switching period, $T_W$ is the time from the MOSFET 40 switch on signal to the $V_{fbl}$ trigger point; and $T_W$ is dependent on the MOSFET 40 hardware used. The $T_W$ is needed because the system is prone to switching noise between the switching on and off of the MOSFET 40. Inserting the value $T_W$ in the algorithm is akin to factoring a delay where the LED driver system reaches a stable operating condition such that a more precise measure can be done.

The voltage across the LED load 90 is calculated based on equation (3) mathematically expressed as:—

$$V_{LED} = \frac{V_{IN}T_{ON}}{T_{OFF}} \frac{N_S}{N_P} \quad (3)$$

Where $N_P$ is the primary winding number and $N_s$ is the secondary winding number of the transfer inductor (or transformer) T1.

An analogue to digital convertor (ADC) 32 may be added to convert the rectified AC output into a digital input voltage signal $V_{IN}$. In addition to receiving $V_{IN}$, controller circuit 30 may also be operable to receive dimmer input $V_{DIM}$ from another ADC 34. For a non-dimmable version of the controller circuit 30, the output of $V_{DIM}$ will be hard wired internally using hardware description language code.

Figure 2:
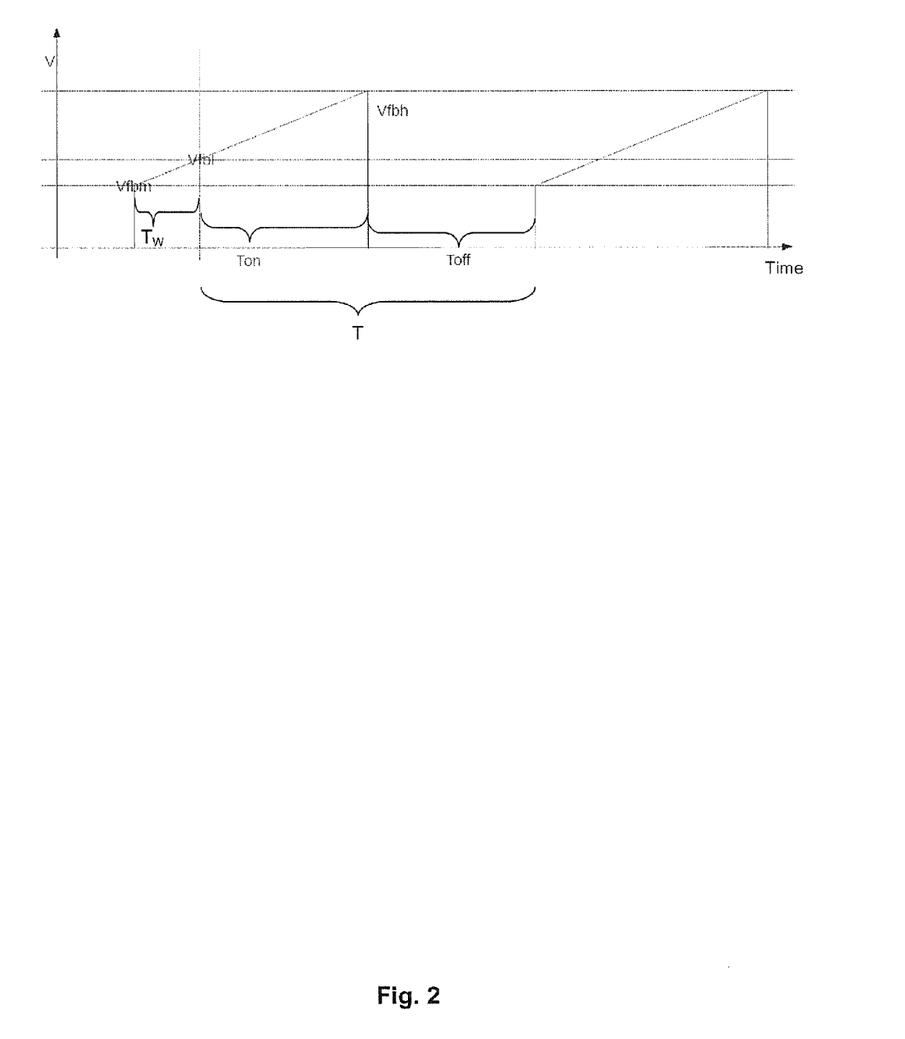
FIG. 2 is a graph illustrating the relationship between the voltage at the electronic switch and time.

The operation of the controller circuit 30 is described as follows with reference to equations (1) and (2) as well as FIG. 2.

In equation (2), the switch on time $T_{ON}$ of the MOSFET 40 is obtained based on the time from which the MOSFET 40 is triggered at $V_{fbl}$ to the time where the voltage reaches the correct value (i.e. the $V_{refl}$, based on comparison with $V_{fbh}$) and the current is at $V_{fbl}/R_1$. The comparator toggles and the time taken between the MOSFET source voltage from $V_{fbl}$ to $V_{fbh}$ is stored in to an internal register as $T_{ON}$.

The switch off time of the MOSFET 40 $T_{OFF}$ is being set or predetermined at each clock cycle by the controller 30 via the ASIC digital algorithm. The predetermined $T_{OFF}$ time ensures that the LED driver 10 operates at a continuous mode. The $T_{OFF}$ time is adjusted based on the following rules (pseudo-codes):—

(i.) If, after $T_W$ time, the output of the comparator of $V_{fbl}$ with the $V_{refl}$ is at a low state, the $T_{OFF}$ time is decreased.
(ii.) If, after $T_W$ time, the output of the comparator of $V_{fbl}$ with the $V_{refl}$ is at a high state, the $T_{OFF}$ time is increased.

It should be appreciated that $T_W$ should ideally approximate 0 for an operation under CCM. Practically, however, the value of $T_w$ will never be 0 due to noise generated by the electronic switch 40 during the initial switch-on period of the electronic switch 40 and therefore equation (2) serves to take into account the value of $T_w$ and the corresponding voltage $V_{fbm}$ at the onset of the switching period.

At each clock cycle, after the MOSFET is switched off, the value of $T_{OFF}$ is increased or decreased in order to maintain the overall system in a continuous mode. It is to be appreciated based on equation (3), that the adjustment of $T_{OFF}$ time depends on the LED load, input voltage $V_{IN}$, $T_{ON}$ time and $N_S/N_P$ ratio of the transfer inductor (or transformer) T1.

In order to avoid errors on the current measure the $V_{fbm}$ point should be computed using equation (1) and (2) as described.

Figure 3:
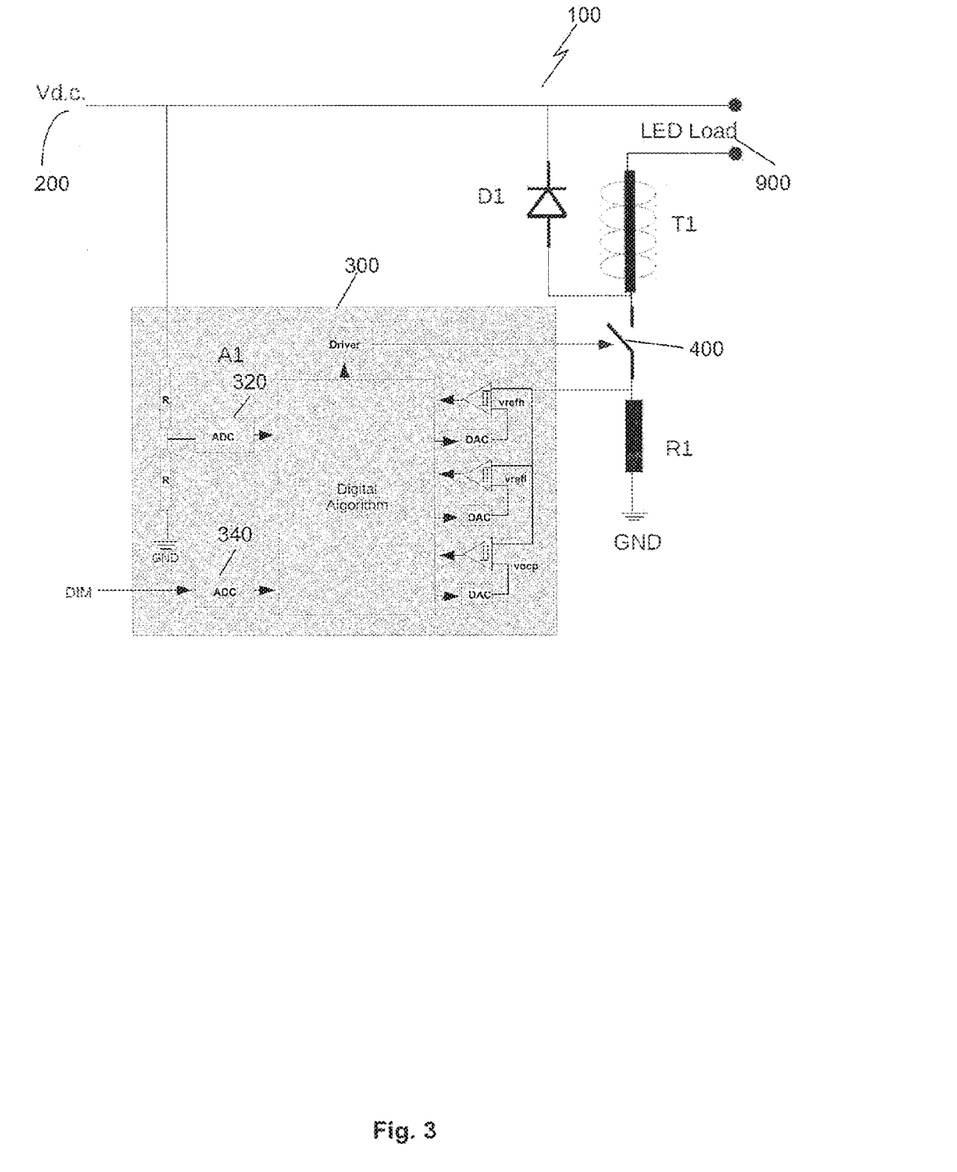
FIG. 3 is a circuit block diagram for a DC to DC hysteretic controller in accordance with another embodiment of the invention.

In accordance with another embodiment and with reference with FIG. 3 there is a LED driver 100 implemented as a single stage DC to DC hysteretic controller. The LED driver 100 comprises DC input 200, controller circuit 300, an electronic switch 400, and a secondary side comprising the LED load 900. The DC input 200 is fed into the controller circuit 300 for processing.

Controller circuit 300 is operable to control the switching time of electronic switch 400 at regular intervals (each interval may correspond with a pre-defined switching cycle) for regulating the electrical voltage and/or current provided to the LED load 900. Controller circuit 300 is typically an integrated circuit (IC) and more preferably, an application specific integrated circuit (ASIC) which may be programmed using one or more of the following hardware description language (HDL) such as Verilog, VHDL, or other hardware description language as known to a person skilled in the art.

The electronic switch 400 is typically a metal-oxide-semiconductor field-effect transistor (MOSFET). The source of the MOSFET switch 400 is connected in series with one end of a resistor R1, while the other end of the resistor R1 connected to electrical ground. The value of the resistor R1 is important to determine the output current $I_{LED}$ selected for the LED, as already mathematically expressed in equation (1) below.

The controller circuit 300 is programmed and configured to receive five inputs; i.e.

(a.) Input voltage $V_{IN}$;
(b.) A $V_{fbh}$ voltage value measured at the source of the MOSFET 400 at each switching cycle and compared with the maximum operation voltage allowable $V_{refh}$ via a voltage comparator;
(c.) A $V_{fbl}$ voltage value measured at the source of the MOSFET 400 at each switching cycle and compared with the minimum operation voltage allowable $V_{refl}$ via a voltage comparator;
(d.) A $V_{ocp}$ voltage value measured at the source of the MOSFET 400 at each switching cycle and compared with a safety voltage value $V_{ocp}$ via a voltage comparator; and
(e.) One or more timer counter(s) for determining the clock cycles and switching time period of the MOSFET 400.

With the described five inputs, controller circuit 300 comprises a digital algorithm (programmable using ASIC) to implement the following equation (4) so as to determine the current $I_{LED}$ to be provided to the LED load 900:—

$$I_{LED} = \frac{\frac{V_{fbm}}{R_1} + \frac{V_{fbh}}{R_1}}{2} \tag{4}$$

Where $V_{fbm}$ is calculated based on equation (2). It is to be appreciated that the method could be applied to forward structure and push-pull configuration.

The voltage of across the LED load 900 is based on $V_{LED}$ as calculated using equation (3).

It is to be appreciated that equation (3) is advantageous in that it allows computation of the voltage in a flyback structure without the need of any feedback from the LED loads 90, 900 at the secondary side. Such an arrangement or configuration avoids the use of opto-couplers when an isolated configuration is used.

In any or all of the described embodiments, the value of input voltage $V_{IN}$ may be used to shape the input current $I_{IN}$. This is done using a multiplication of $V_{IN}$ by a multiplier variable α. The multiplier variable α may be adjusted at each clock cycle by the digital algorithm. This is based on the fact that for different output power the voltage is multiplied by different factor to obtain the necessary $I_{LED}$.

The multiplier variable α may be stored in the ASIC for the adjustment of current $I_{IN}$. The higher the value of multiplier a, the higher the current $I_{IN}$. The multiplier a may also be used to fix the comparator voltages $V_{refl}$ and $V_{refh}$.

As an example, if the multiplier value a is set to a value of 1, voltages $V_{refh}$ and $V_{refl}$ are set to track the input voltage $V_{IN}$ and is thus in phase with the input signal coming from the AC mains. This is useful because the power factor correction compensation is directly accounted for by the ASIC controller's system algorithm. In a flyback structure the input current is pulsed, the pulse corresponding to the MOSFET 40, 400 switch on time. The integration of these pulses allows a skilled person to compute the input current $I_{IN}$. If this input current $I_{IN}$ is in phase with the input A.C. signal a high value of PFC like 0.98 could be achieved.

In another embodiment, instead of a linear relationship between $V_{IN}$ and compensation curve could be implemented in the a parameter. A quadratic relationship is mathematically expressed in equation (5).

$$I_{IN} = \alpha V_{IN}^2 \tag{5}$$

Higher order relationship between $I_{IN}$ and $V_{IN}$ may also be possible.

This compensation curve can be stored in an internal ROM of the controller 30, 300. In some configurations the current $I_{IN}$ is in the centre of the input AC main voltage, where the voltage is higher in order to obtain better power factor or to be compliant with other electrical specification (e.g. distortion level, level of acceptable ripple in the current) which may be adjusted at each clock cycle by the digital algorithm.

The value of the multiplier variable α may be increased or decreased following the output voltage changes according to equation (3).

An example is if α=2, based on the relationship depicted in equation (5) a double of the output current is achieved. This allows us to compensate input voltage variation, output loading and allow us to have dimming capability.

It is to be further appreciated that in the case of a boost structure, equation (3) may be modified as:—

$$V_{LED} = \frac{V_{IN}}{T_{OFF}} T \quad (3a)$$

In another embodiment of the invention, the controller 30 may be used to implement a voltage based control instead of a current based control. In particular, equation (3) and equation (3a) may be made the subject for the voltage control.

Some of the non-exhaustive example applications of the described embodiments may be as follows:—
i. Isolated switched mode power supply (SMPS) for voltage regulation. For example for standard isolated 5V power supply connected to the mains;
ii. Isolated battery charger. As the voltage and current are known values, the drivers may be utilized as a good battery charger in an isolated configuration and without opto-couplers;
iii. Analog signal transmission; and
iv. Audio signal transmission for power amplifier.

It should be appreciated by the person skilled in the art that the above invention is not limited to the embodiments described. In particular, the following modifications and improvements may be made without departing from the scope of the present invention:

Although the embodiments are described with reference to LED loads 90, 900, it is to be appreciated that the device may be used to provide regulated current to other types of electrical loads including laptops, computer devices etc.

The ASIC controller circuit 30, 300 may be implemented having a 12-bit resolution.

It should be further appreciated by the person skilled in the art that features and modifications as discussed in each embodiments above, not being alternatives or substitutes unless expressly stated, may be combined to form yet other embodiments that fall within the scope of the invention described.

The claims defining the invention are as follows:

1. A device for providing regulated current to an electrical load comprising
    a current controller operable at clock cycles to receive:—
    i. a desired input reference voltage; and
    ii. a feedback voltage obtained from an electronic switch; wherein the current controller compares the feedback voltage with the desired input reference voltage, provides regulated current, $I_{LED}$, to the electrical load based on calculation of a switch off time of the electronic switch at each of the clock cycles and determines the regulated current using the feedback voltage, the switch off time, a switch on time of the electronic switch and a duration between the switch on time to a lowest feedback voltage measured at the electronic switch at each of the clock cycles; wherein the calculation of the switch off time achieves a continuous-conduction-mode (CCM) for the device under normal operating conditions.

2. The device according to claim 1, wherein the electronic switch is a MOSFET.

3. The device according to claim 2, wherein the feedback voltage is measured at a source of the MOSFET at each of the clock cycles and compared with a maximum operation voltage $V_{refh}$ via a voltage comparator.

4. The device according to claim 2, wherein the feedback voltage is measured at a source of the MOSFET at each of the clock cycles and compared with a minimum operation voltage $V_{refl}$ via a voltage comparator.

5. The device according to claim 2, wherein the feedback voltage is measured at a source of the MOSFET at each of the clock cycles and compared with a safety voltage value $V_{ocp}$ via a voltage comparator.

6. The device according to claim 2, wherein for a single stage flyback convertor configuration, the current controller determines the regulated current $I_{LED}$ based on the mathematical expression $$I_{LED} = \frac{T_{OFF}\left(\frac{V_{fbh}}{R_1} + \frac{V_{fbm}}{R_1}\right)}{2T}$$

wherein T is a period of each of the clock cycles; $T_{OFF}$ is the switch-off period at each of the clock cycles; $R_1$ is a resistance of resistor of a source of the MOSFET; $V_{fbh}$ is a highest feedback voltage measured at the source of the MOSFET at each of the clock cycles; and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fbl}$ measured at the source of the MOSFET at each of the clock cycles.

7. The device according to claim 6 wherein a voltage, $V_{LOAD}$, across the electrical load is determined based on the following mathematical expression $$V_{load} = \frac{V_{IN}T_{ON}}{T_{OFF}} \frac{N_S}{N_P}$$

where $N_P$ is a primary winding number and $N_S$ is the secondary winding number of a transformer in the single stage flyback convertor configuration.

8. The device according to claim 2, wherein for a single stage forward structure, push-pull configuration or DC to DC hysteretic controller, the current controller determines the regulated current $I_{LED}$ based on the mathematical expression $$I_{LED} = \frac{\frac{V_{fbm}}{R_1} + \frac{V_{fbh}}{R_1}}{2}$$

where $R_1$ is a resistance of a resistor of a source of the MOSFET; $V_{fbh}$ is a highest feedback voltage measured at the source of the MOSFET at each of the clock cycles; and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fbl}$ measured at the source of the MOSFET at each of the clock cycles.

9. A device according to claim 8, wherein a voltage, $V_{LOAD}$, across the electrical load is determined based on the following mathematical expression $$V_{LOAD} = \frac{V_{IN}}{T_{OFF}}T$$

wherein T is a period of each of the clock cycles; $T_{OFF}$ is a switch-off period for each of the clock cycles; and $V_{IN}$ is an digital input voltage of a rectified AC output.

10. The device according to claim 9, wherein the input voltage $V_{IN}$ is used to shape the input current $I_{IN}$ based on the following mathematical expression $$I_{IN} = \alpha_{IN}$$

wherein α is a multiplier.

11. The device according to claim 1, wherein an input voltage $V_{IN}$ received at the input of the current controller is used to derive an input current $I_{IN}$ based on the following mathematical expression $$I_{IN} = \alpha V_{IN}$$

wherein α is a multiplier.

12. A method for providing regulated current to an electrical load comprising:
  receiving a desired input reference voltage from a current controller;
  obtaining a feedback voltage from an electronic switch at clock cycles;
  comparing the feedback voltage with the desired input reference voltage:
  providing regulated current, $I_{LED}$, to the electrical load based on calculation of a switch off time of the electronic switch at each of the clock cycles; and
  determining the regulated current using the feedback voltage, the switch off time, a switch on time of the electronic switch and a duration between the switch on time to a lowest feedback voltage measured at the electronic switch at each of the clock cycles; wherein the calculation of the switch off time achieves a continuous-conduction-mode (CCM) for the device under normal operating conditions.

13. The method according to claim 12, wherein the electronic switch is a MOSFET.

14. The method according to claim 13, wherein the feedback voltage is measured at a source of the MOSFET at each of the clock cycles and compared with a maximum operation voltage $V_{refh}$ via a voltage comparator.

15. The method according to claim 13, wherein the feedback voltage is measured at a source of the MOSFET at each of the clock cycles and compared with a minimum operation voltage $V_{refl}$ via a voltage comparator.

16. The method according to claim 13, wherein the feedback voltage is measured at a source of the MOSFET at each of the clock cycles and compared with a safety voltage value $V_{ocp}$ via a voltage comparator.

17. The method according to claim 13, wherein for a single stage flyback convertor configuration, the method further comprises determining the regulated current $I_{LED}$ based on the mathematical expression $$I_{LED} = \frac{T_{OFF}\left(\frac{V_{fbh}}{R_1} + \frac{V_{fbm}}{R_1}\right)}{2T}$$

wherein T is a period of each of the clock cycles; $T_{OFF}$ is the switch-off period at each of the clock cycles; $R_1$ is a resistance of resistor of a source of the MOSFET; $V_{fbh}$ is a highest feedback voltage measured at the source of the MOSFET at each of the clock cycles; and $V_{fbm}$ is determined based on the following mathematical expression:—

$$V_{fbm} = \frac{T_{on}V_{fbl} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fbl}$ measured at the source of the MOSFET at each of the clock cycles.

18. The method according to claim 17, further comprising determining a voltage, $V_{LOAD}$, across the electrical load based on the following mathematical expression $$V_{load} = \frac{V_{IN}T_{ON}}{T_{OFF}} \frac{N_S}{N_P}$$

where $N_P$ is a primary winding number and $N_s$ is the secondary winding number of a transformer in the single stage flyback convertor configuration.

19. The method according to claim 13, wherein for a single stage forward structure, push-pull configuration or DC to DC hysteretic controller, the method further comprises determining the regulated current $I_{LED}$ based on the mathematical expression $$I_{LED} = \frac{\frac{V_{fbm}}{R_1} + \frac{V_{fbh}}{R_1}}{2}$$

where $R_1$ is a resistance of a resistor of a source of the MOSFET; $V_{fbh}$ is a highest feedback voltage measured at the source of the MOSFET at each of the clock cycles; and $V_{fbm}$ is determined based on the following mathematical expression:—

$$V_{fbm} = \frac{T_{on}V_{fbh} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fb1}$ measured at the source of the MOSFET at each of the clock cycles.

20. The method according to claim 19, further comprising determining a voltage, $V_{LOAD}$, across the electrical load based on the following mathematical expression $$V_{LOAD} = \frac{V_{IN}}{T_{OFF}}T$$

wherein T is a period of each of the clock cycles; $T_{OFF}$ is a switch-off period for each of the clock cycles; and $V_{IN}$ is an digital input voltage of a rectified AC output.

21. The method according to claim 20, further comprising using an input voltage $V_{IN}$ received at the input of the current controller to derive an input current $I_{IN}$ based on the following mathematical expression $$I_{IN} = \alpha V_{IN}$$

wherein $\alpha$ is a multiplier.

22. The method according to claim 12, further comprising using an input voltage $V_{IN}$ received at the input of the current controller to derive an input current $I_{IN}$ based on the following mathematical expression $$I_{IN} = \alpha V_{IN}$$

wherein $\alpha$ is a multiplier.

* * * * *

UNITED STATES PATENT AND TRADEMARK OFFICE
CERTIFICATE OF CORRECTION

PATENT NO. : 9,877,363 B2
APPLICATION NO. : 15/112425
DATED : January 23, 2018
INVENTOR(S) : Francis Kai Fook Wee, Leopoldo Groppi and Andrea Stona It is certified that error appears in the above-identified patent and that said Letters Patent is hereby corrected as shown below:

In the Claims

Column 10, Lines 45-56, Claim 7, should read as follows:
7. The device according to claim 2, wherein for a single stage forward structure, push-pull configuration or DC to DC hysteretic controller, the current controller determines the regulated current $I_{LED}$ based on the mathematical expression $$I_{LED} = \frac{\frac{V_{fbm}}{R_1} + \frac{V_{fbh}}{R_1}}{2}$$

where $R_1$ is a resistance of a resistor of a source of the MOSFET; $V_{fbh}$ is a highest feedback voltage measured at the source of the MOSFET at each of the clock cycles; and $V_{fbm}$ is determined based on the following mathematical expression:-

$$V_{fbm} = \frac{T_{on}V_{fbl} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fbl}$ measured at the source of the MOSFET at each of the clock cycles.

Column 10, Lines 56-Column 11, Lines 1-15, Claim 8 should read as follows:
8. The device according to claim 6 wherein a voltage, $V_{LOAD}$, across the electrical load is determined based on the following mathematical expression $$V_{load} = \frac{V_{IN}T_{ON}}{T_{OFF}} \frac{N_S}{N_P}$$

where $N_P$ is a primary winding number and $N_s$ is the secondary winding number of a transformer in the single stage flyback convertor configuration.

Signed and Sealed this
Twenty-ninth Day of October, 2019

Andrei Iancu
*Director of the United States Patent and Trademark Office*

CERTIFICATE OF CORRECTION (continued)
U.S. Pat. No. 9,877,363 B2

Column 11, Lines 16 - approximately 27, Claim 9 should read as follows:
9. A device according to claim 7, wherein a voltage, $V_{LOAD}$, across the electrical load is determined based on the following mathematical expression $$V_{LOAD} = \frac{V_{IN}}{T_{OFF}} T$$

wherein $T$ is a period of each of the clock cycles; $T_{OFF}$ is a switch-off period for each of the clock cycles; and $V_{IN}$ is an digital input voltage of a rectified AC output.

Column 11, approximately Lines 28-34, Claim 10 should read as follows:
10. The device according to claim 1, wherein an input voltage $V_{IN}$ received at the input of the current controller is used to derive an input current $I_{IN}$ based on the following mathematical expression $$I_{IN} = \alpha V_{IN}$$

wherein $\alpha$ is a multiplier.

Column 11, approximately Lines 28-40, Claim 11 should read as follows:
11. The device according to claim 9, wherein the input voltage $V_{IN}$ is used to shape the input current $I_{IN}$ based on the following mathematical expression $$I_{IN} = \alpha V_{IN}$$

wherein $\alpha$ is a multiplier.

Column 12, approximately Lines 34-45, Claim 18 should read as follows:
18. The method according to claim 13, wherein for a single stage forward structure, push-pull configuration or DC to DC hysteretic controller, the method further comprises determining the regulated current $I_{LED}$ based on the mathematical expression $$I_{LED} = \frac{\frac{V_{fbm}}{R_1} + \frac{V_{fbh}}{R_1}}{2}$$

where $R_1$ is a resistance of a resistor of a source of the MOSFET; $V_{fbh}$ is a highest feedback voltage measured at the source of the MOSFET at each of the clock cycles; and $V_{fbm}$ is determined based on the following mathematical expression:-

$$V_{fbm} = \frac{T_{on} V_{fbl} - T_w V_{fbh}}{T_{on} - T_w}$$

where $T_{ON}$ is the switch on time of the MOSFET at each of the clock cycles; and $T_W$ is the time from switching on the MOSFET switch to the occurrence of a lowest feedback voltage $V_{fbl}$ measured at the source of the MOSFET at each of the clock cycles.

Column 12, Lines 46-Column 13, Lines 1-5, Claim 19 should read as follows:
19. The method according to claim 17, further comprising determining a voltage, $V_{LOAD}$, across the electrical load based on the following mathematical expression $$V_{load} = \frac{V_{IN} T_{ON}}{T_{OFF}} \frac{N_S}{N_P}$$

where $N_P$ is a primary winding number and $N_s$ is the secondary winding number of a transformer in the single stage flyback convertor configuration.

Column 13, Lines 6-16, Claim 20 should read as follows:
20. The method according to claim 18, further comprising determining a voltage, $V_{LOAD}$, across the electrical load based on the following mathematical expression $$V_{LOAD} = \frac{V_{IN}}{T_{OFF}} T$$

wherein $T$ is a period of each of the clock cycles; $T_{OFF}$ is a switch-off period for each of the clock cycles; and $V_{IN}$ is an digital input voltage of a rectified AC output.

Column 13, Lines 17-23, Claim 21 should read as follows:
21. The method according to claim 12, further comprising using an input voltage $V_{IN}$ received at the input of the current controller to derive an input current $I_{IN}$ based on the following mathematical expression $$I_{IN} = \alpha V_{IN}$$

wherein α is a multiplier.

Column 13, Lines 24-30, Claim 22 should read as follows:
22. The method according to claim 20, further comprising using an input voltage $V_{IN}$ received at the input of the current controller to derive an input current $I_{IN}$ based on the following mathematical expression $$I_{IN} = \alpha V_{IN}$$

wherein α is a multiplier.